(12) United States Patent
Yamamuro et al.

(10) Patent No.: US 10,687,450 B2
(45) Date of Patent: Jun. 16, 2020

(54) COMPONENT CHUCK DEVICE AND COMPONENT MOUNTING DEVICE

(71) Applicant: FUJI CORPORATION, Chiryu-shi (JP)

(72) Inventors: Junichi Yamamuro, Chiryu (JP); Satoru Otsubo, Anjo (JP)

(73) Assignee: FUJI CORPORATION, Chiryu-shi (JP)

( * ) Notice: Subject to any disclaimer, the term of this patent is extended or adjusted under 35 U.S.C. 154(b) by 269 days.

(21) Appl. No.: 15/761,236

(22) PCT Filed: Sep. 29, 2015

(86) PCT No.: PCT/JP2015/077465
§ 371 (c)(1),
(2) Date: Mar. 19, 2018

(87) PCT Pub. No.: WO2017/056181
PCT Pub. Date: Apr. 6, 2017

(65) Prior Publication Data
US 2018/0263148 A1      Sep. 13, 2018

(51) Int. Cl.
*H05K 13/04*      (2006.01)
*B25B 11/00*      (2006.01)
(Continued)

(52) U.S. Cl.
CPC .......... *H05K 13/0408* (2013.01); *B25B 5/02* (2013.01); *B25B 11/005* (2013.01); *B25J 15/08* (2013.01);
(Continued)

(58) Field of Classification Search
CPC ............... H05K 3/306; H05K 13/0404; H05K 13/0406; H05K 13/0408; H05K 13/0409;
(Continued)

(56) References Cited

U.S. PATENT DOCUMENTS 4,810,018 A    3/1989  Van De Ven et al.
4,822,091 A *  4/1989  Vermeer ............ H05K 13/0408
                                              294/86.4
(Continued)

FOREIGN PATENT DOCUMENTS

EP      0 282 140 A2    9/1988
EP      2 829 354 B1    9/2017
(Continued)

OTHER PUBLICATIONS

International Search Report dated Nov. 17, 2015 in PCT/JP2015/077465 filed Sep. 29, 2015.
Extended European Search Report dated Apr. 23, 2019 in Patent Application No. 15905336.2, 8 pages.

*Primary Examiner* — Peter Dungba Vo
*Assistant Examiner* — Joshua D Anderson
(74) *Attorney, Agent, or Firm* — Oblon, McClelland, Maier & Neustadt, L.L.P.

(57) ABSTRACT

A component chuck device moves a pusher member downward when negative pressure is supplied, and holds a posture of a component by causing the pusher member to abut with an upper face of the component that is gripped in a gripping mechanism. Then, the component chuck device releases gripping of the component when supply of negative pressure is stopped, and a lead of the component is inserted into a hole of a substrate while holding the posture of the component by moving the pusher member downward while remaining abutted with the upper face of the component.

8 Claims, 8 Drawing Sheets

(51) Int. Cl.
*B25B 5/02* (2006.01)
*B25J 15/08* (2006.01)

(52) U.S. Cl.
CPC ..... *H05K 13/0409* (2018.08); *H05K 13/0413* (2013.01); *Y10T 29/49133* (2015.01); *Y10T 29/49139* (2015.01); *Y10T 29/53183* (2015.01)

(58) Field of Classification Search
CPC ............ H05K 13/0413; Y10T 29/4913; Y10T 29/49133; Y10T 29/49139; Y10T 29/53174; Y10T 29/53183; Y10T 29/53265; B25B 5/02; B25J 15/0023; B25J 15/08; B25J 15/083
See application file for complete search history.

(56) References Cited

U.S. PATENT DOCUMENTS

| | | | |
|---|---|---|---|
| 4,944,086 A | * | 7/1990 | Nishihara .......... H05K 13/0408 29/837 |
| 2002/0083584 A1 | | 7/2002 | Isogai et al. |
| 2005/0246890 A1 | | 11/2005 | Isogai et al. |
| 2006/0207090 A1 | | 9/2006 | Kawada |
| 2016/0295756 A1 | | 10/2016 | Yamamuro |

FOREIGN PATENT DOCUMENTS

| | | |
|---|---|---|
| JP | 63-236400 A | 10/1988 |
| WO | 2013/140571 A1 | 9/2013 |
| WO | 2015/052753 A1 | 4/2015 |

\* cited by examiner (a)

(b)

(a) A-A cross section (b) B-B cross section (c) C-C cross section (d) D-D cross section ○ When supplying negative pressure ○ When stopped supplying negative pressure ○ When supplying positive pressure

COMPONENT CHUCK DEVICE AND COMPONENT MOUNTING DEVICE

CROSS-REFERENCE TO RELATED APPLICATION

This application is a United States national stage application of International Application No. PCT/JP2015/077465, filed Sep. 29, 2015, which designates the United States, and the entire contents of this international application are hereby incorporated herein by reference in entirety.

TECHNICAL FIELD

The present invention relates to a component chuck device and component mounting device.

BACKGROUND ART

There are known conventional devices that mount a component with a protruding pin on a substrate using a component chuck device that is provided with a clamp section that clamps the component from the sides and a pusher section that presses the component from above. For example, a component chuck device of PTL 1, when negative pressure is supplied, moves to a standby position at which a clamp section clamps the component while the pusher section does not contact the component, and, when positive pressure is supplied, presses down the component with the pusher section while the clamping of the component by the clamp section is released. Thereby, a pin of the component is inserted in a hole of the substrate and the component is mounted on the substrate.

CITATION LIST

Patent Literature

PTL 1 WO2013/140571

SUMMARY OF INVENTION

Technical Problem

However, with the component chuck device described above, due to deviation of the timing at which the clamp section releases the clamp and the timing at which the pusher section starts to press down the component, there may arise a time during which the component is not supported, resulting in the posture of the component not being stable, such as being inclined, prior to the pin of the component being inserted into the hole of the substrate. In this case, it is difficult to appropriately mount the component on the substrate.

A main object of the present invention is to stabilize the posture of the component during mounting.

Solution to Problem

The present invention adopts the following means to achieve the main object described above.

In summary, a component chuck device of the present invention is configured to insert an insertion section of a gripped component in an insertion target section of a substrate, and the component chuck device includes a gripping mechanism configured to grip the component in a state in which negative pressure is supplied and a holding mechanism configured to hold a posture of the component using a holding member, in which the holding mechanism configured to operate to hold the posture of the component using the holding member in both a state in which negative pressure is supplied or a state after supply of negative pressure is stopped.

In the component chuck device of the present invention, the holding member is configured to hold the posture of the component in both a state in which negative pressure is supplied and a state after supply of negative pressure is stopped. Thereby, it is possible to continue holding the posture of the component using the holding mechanism and stabilize the posture of the component while mounted even if gripping of the component by the gripping mechanism is released by stopping supply of negative pressure or supplying positive pressure.

DESCRIPTION OF EMBODIMENTS

Figure 1:
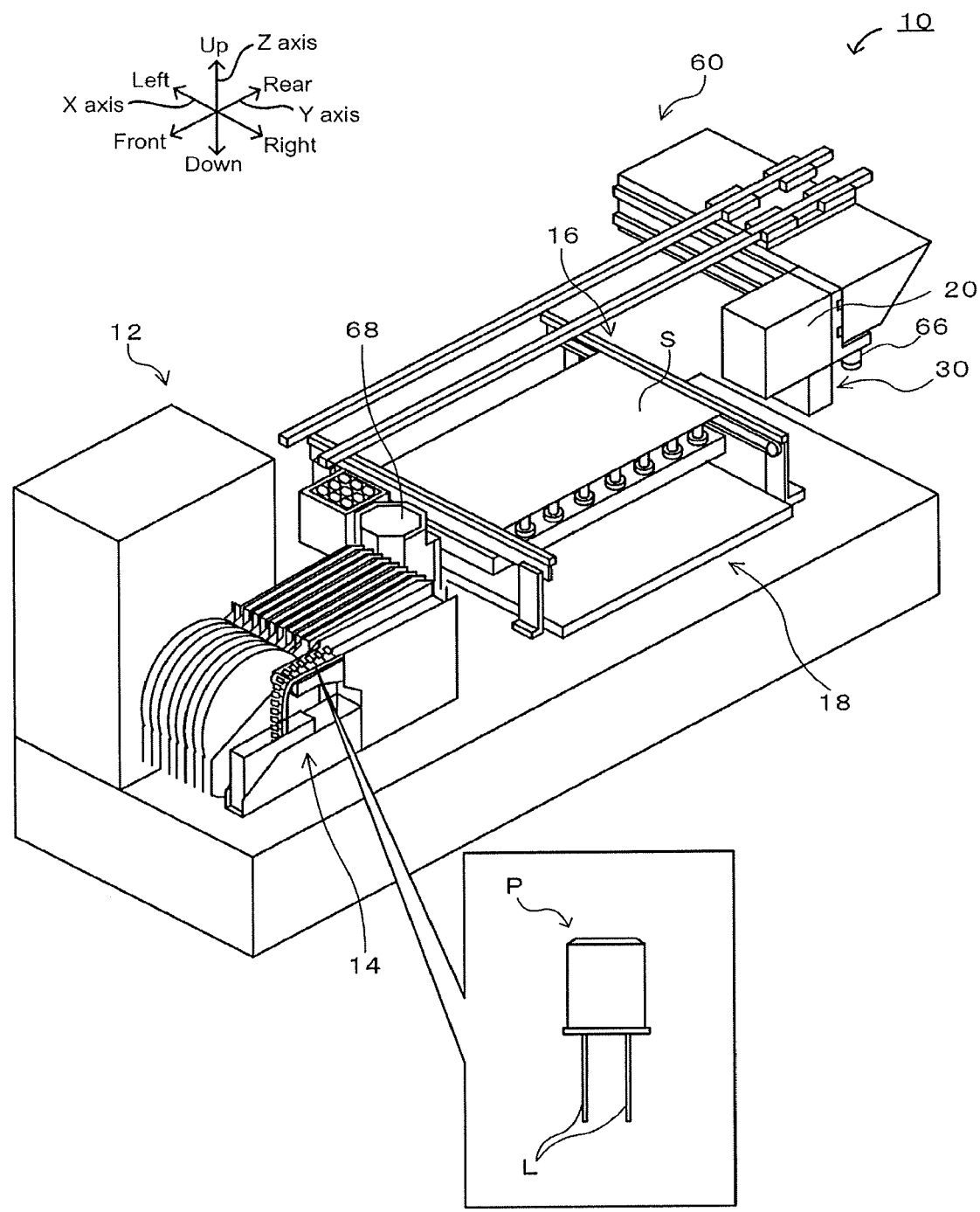
FIG. 1 is a configuration diagram illustrating an outline configuration of component mounting device 10.
Figure 2:
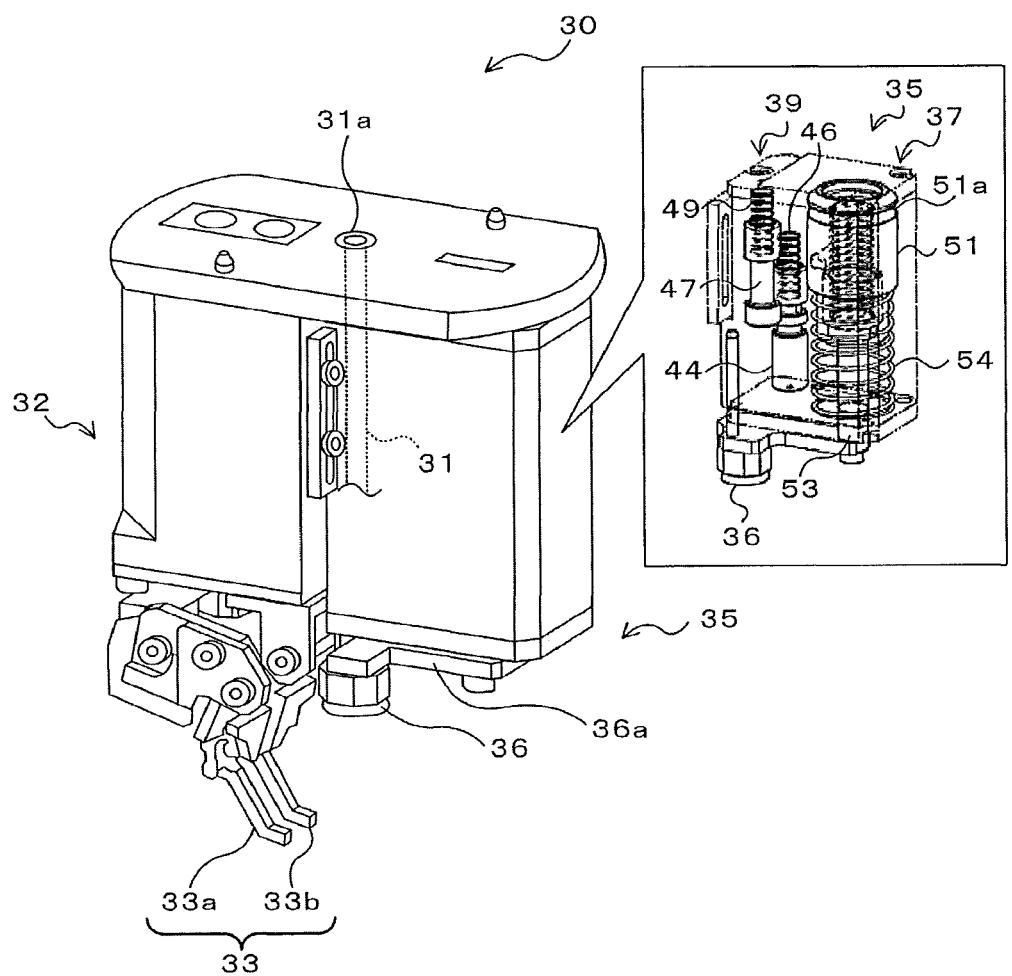
FIG. 2 is a configuration diagram illustrating an outline configuration of component chuck device 30.
Figure 3:
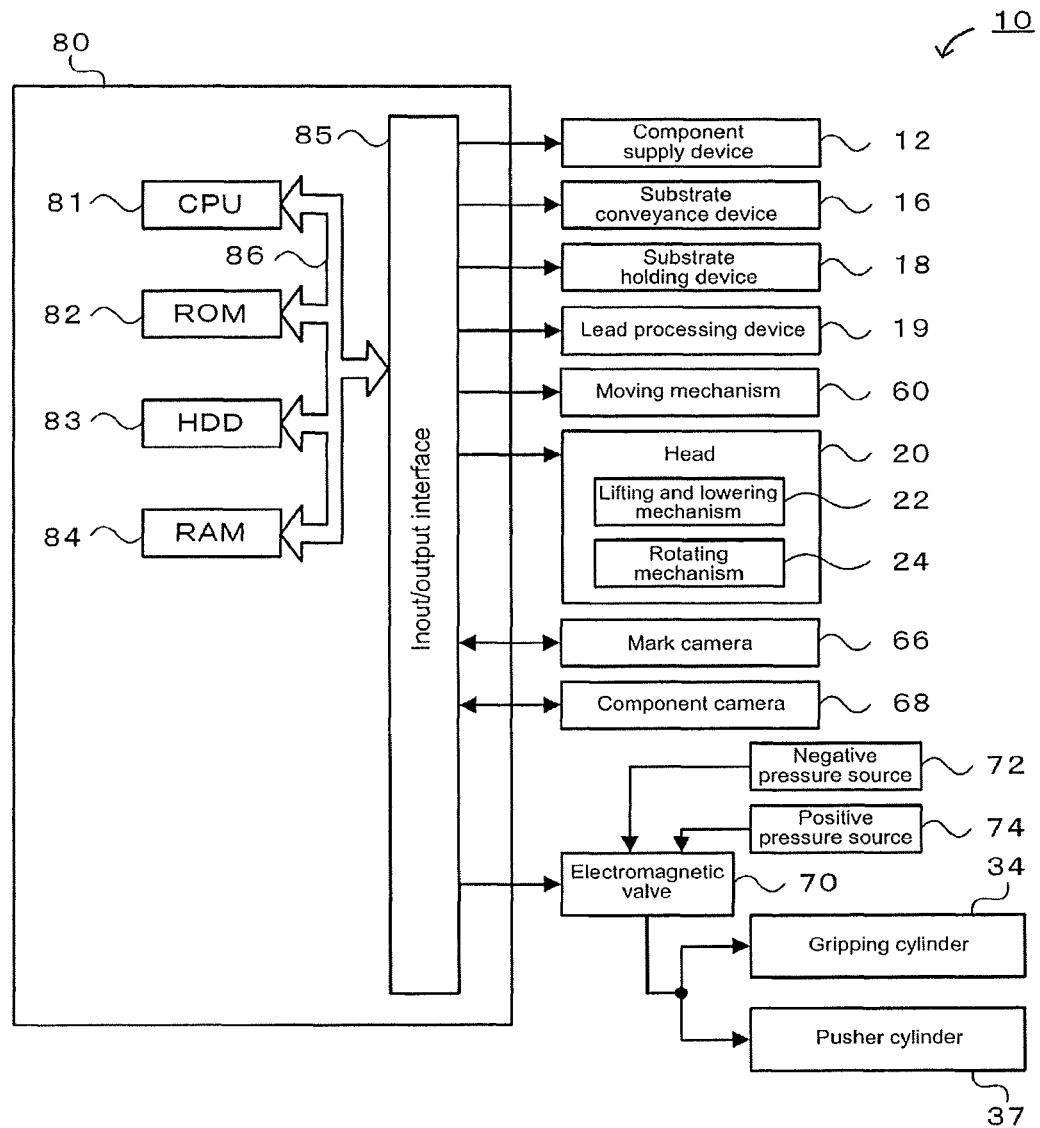
FIG. 3 is block diagram illustrating a configuration related to control of component mounting device 10.

FIG. 1 is a configuration diagram illustrating an outline configuration of component mounting device 10, FIG. 2 is a configuration diagram illustrating an outline configuration of component chuck device 30, and FIG. 3 is block diagram illustrating a configuration related to control of component mounting device 10. Note that, a left-right direction in FIG. 1 is an X-axis direction, a front-rear direction is a Y-axis direction, and an up-down direction is a Z-axis direction.

As shown in FIG. 1, component mounting device 10 is provided with component supply device 12 that supplies a component P, substrate conveyance device 16 that conveys a flat plate form substrate S, substrate holding device 18 that holds the conveyed substrate S, head 20 to which component chuck device 30, which grips a component P, is attached, and moving mechanism 60 that moves head 20 in XY-directions. In addition, component mounting device 10 is provided with mark camera 66 that images a mark that is attached to the substrate S, component camera 68 that images the component P which is gripped in component chuck device 30, and control device 80 that controls the entirety of component mounting device 10 (refer to FIG. 3). Component chuck device 30 is detachably attached to head 20. Additionally to component chuck device 30, a component suction device that suctions the component P using a nozzle is attachable to head 20. Note that, the substrate S includes, for example, a printed wiring board that is a circuit board, a printed circuit board on which an electronic circuit component is mounted and electrically connected on one surface and an electronic circuit component is not mounted on the other side, a substrate constituting a chip-mounted substrate on which a bare chip is mounted, a substrate on which the electronic circuit component that is provided with a ball grid array is installed, and the like.

Component supply device 12 is provided with tape feeder 14 and the like that supplies the component P by delivering tape to which the component P with a lead (radial component, axial component, or the like) is attached. When the component P is mounted on the substrate S, a lead L (insertion section) is inserted into a hole H (insertion target section) that is formed on the substrate S. In addition, component mounting device 10 is provided with lead processing device 19 (refer to FIG. 3) that bends or cuts the lead L that is inserted into the hole H.

Head 20 is provided with lifting and lowering mechanism 22 (refer to FIG. 3) and rotating mechanism 24 (refer to FIG. 3), and the attached component chuck device 30 is lifted and lowered in the Z-axis direction and rotated around an axis. An air flow path which is not shown in the drawings is provided inside head 20. The air flow path is connected to negative pressure source 72 (refer to FIG. 3) such as a vacuum pump and positive pressure source 74 (refer to FIG. 3) such as a compressor through electromagnetic valve 70 (refer to FIG. 3).

As shown in FIG. 2, component chuck device 30 is provided with gripping mechanism 32 that grips the component P, and pusher mechanism 35 that is able to extrude the component P downward. Gripping mechanism 32 is provided with a pair of left and right gripping claws 33 (33a, 33b), and an air-driven gripping cylinder 34 that opens and closes gripping claws 33 (refer to FIG. 3). Gripping mechanism 32 is configured so as to grip the component P by moving gripping claws 33 from a standby position in a closing direction by driving of gripping cylinder 34 in a state in which negative pressure is supplied and to release gripping by gripping claws 33 when supply of negative pressure is stopped. For example, gripping mechanism 32 may be configured such that gripping claws 33 are closed against biasing by a spring when negative pressure is supplied and gripping claws 33 are opened by biasing by the spring when negative pressure is stopped. Alternatively, gripping mechanism 32 may be configured such that gripping claws 33 are closed when negative pressure is supplied and gripping claws are opened when positive pressure is supplied. Pusher mechanism 35 is provided with pusher member 36 that is able to abut with the upper face of the component P, an air-driven pusher cylinder 37 that lifts and lowers pusher member 36, and flow path switching valve 39 that switches air supply to pusher cylinder 37.

In addition, in component chuck device 30, connection port 31a of air supply path 31 is exposed to an attachment surface for head 20, and connection port 31a is connected to the air flow path of head 20 when attached to head 20. Therefore, in air supply path 31, negative pressure from negative pressure source 72 or positive pressure from positive pressure source 74 is supplied by the operation of electromagnetic valve 70. Air supply path 31 is able to supply air to gripping cylinder 34 and pusher cylinder 37 (flow path switching valve 39). That is, air supply path 31 is also used for supply of air to gripping mechanism 32 and pusher mechanism 35.

As shown in FIG. 3, control device 80 is provided with CPU 81, ROM 82, HDD 83, RAM 84, and input and output interface 85. These elements are electrically connected via bus 86. Control device 80 inputs an image signal from mark camera 66, an image signal from component camera 68, or the like via input and output interface 85. Meanwhile, from control device 80, a drive signal to each device such as component supply device 12, substrate conveyance device 16, substrate holding device 18, and lead processing device 19, a drive signal to moving mechanism 60, a drive signal to head 20 (lifting and lowering mechanism 22, rotating mechanism 24), a drive signal to electromagnetic valve 70, and the like are output via input and output interface 85.

Figure 4:
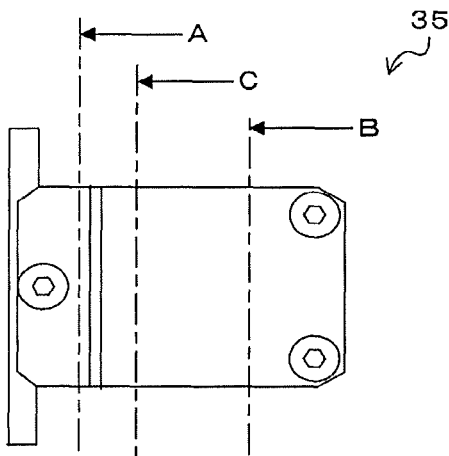
FIG. 4 illustrates outer appearance views of pusher mechanism 35 of component chuck device 30.
Figure 4:
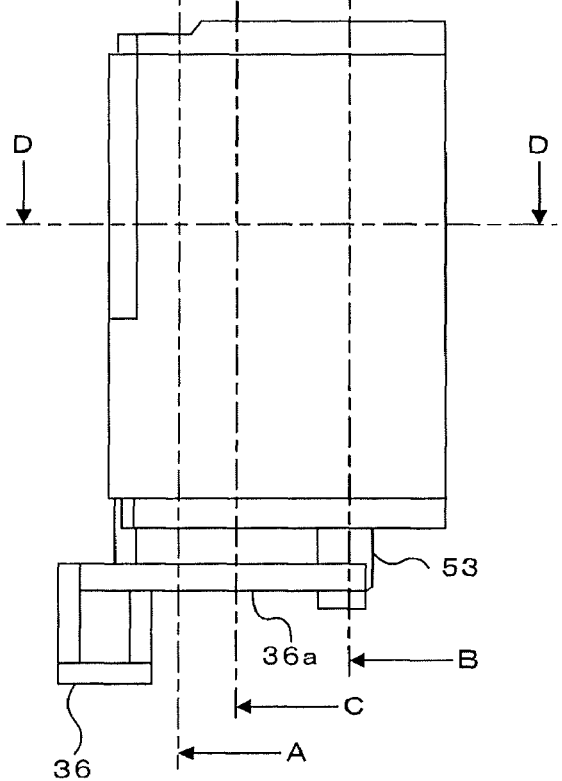
Figure 5:
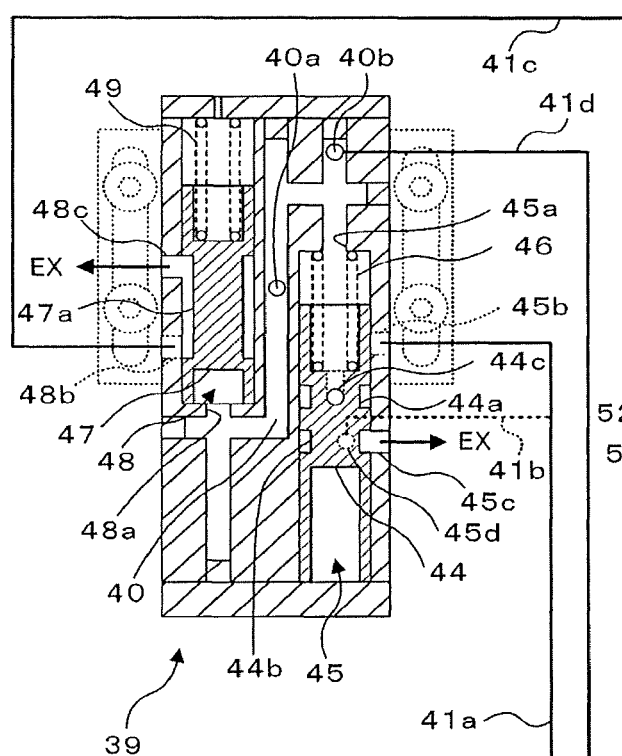
FIG. 5 illustrates configuration diagrams illustrating outline configurations of pusher mechanism 35.
Figure 5:
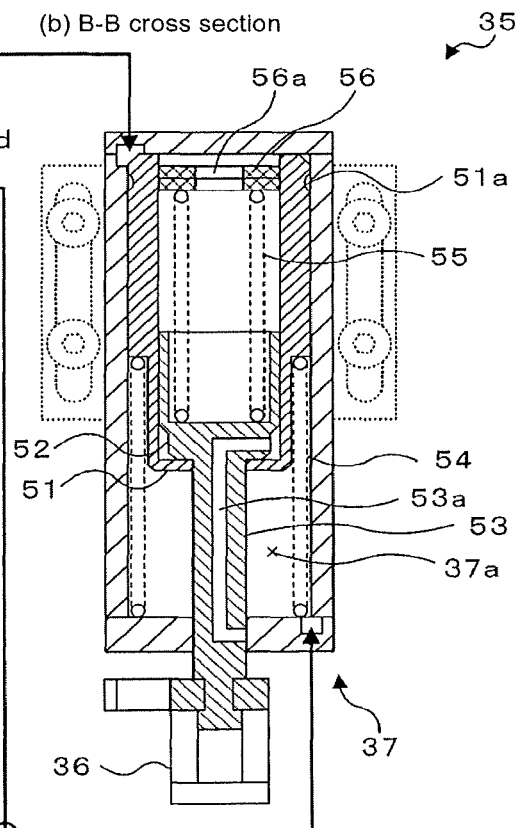
Figure 5:
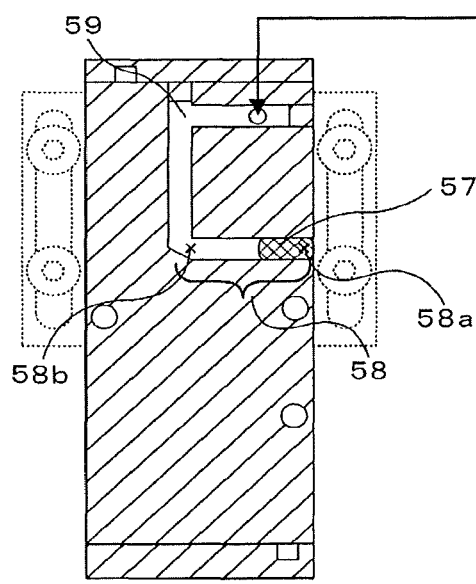
Figure 5:
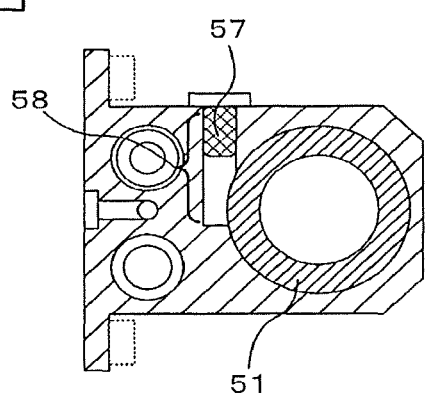

Pusher mechanism 35 of component chuck device 30 will be described in detail below. FIG. 4 illustrates outer appearance views of pusher mechanism 35 of component chuck device 30, and FIG. 5 illustrates outline configurations of the pusher mechanism 35. FIG. 5 illustrates sectional views of FIG. 4 of pusher mechanism 35. Note that, FIG. 5(a) is used to mainly illustrate flow path switching valve 39, FIG. 5(b) is used to mainly illustrate the pusher cylinder 37, and FIGS. 5(c) and 5(d) are used to mainly illustrate locking member 57 which will be described later. Note that, for ease of understanding, FIG. 5(a) includes some elements not appearing on the A-A cross section in FIG. 4.

Flow path switching valve 39 is formed of air flow path 40 that has air supply port 40a which is connected to air supply path 31, negative pressure spool chamber 45 that is connected to air flow path 40 and in which negative pressure spool 44 slides in the up-down direction, and positive pressure spool chamber 48 that is connected to air flow path 40 and in which positive pressure spool 47 slides in the up-down direction.

Negative pressure spool chamber 45 is a cylindrical cavity and is formed of input port 45a into which air is input from air flow path 40 on the upper end in the axial direction. In addition, negative pressure spool chamber 45 is formed of output port 45b that is connected to negative pressure supply path 41a on the side, atmosphere open port 45c that is connected to the outside (open to the air), and branch path communication port 45d that is connected to branch path 41b which is branched from negative pressure supply path 41a. Note that, output port 45b and branch path communication port 45d are elements that do not appear on the A-A cross section, but are illustrated in FIG. 5(a).

Negative pressure spool 44 is formed to have a diameter to be able to slide within negative pressure spool chamber 45, and is a stepped shaft-like member in which a first small diameter section 44a and a second small diameter section 44b which are one step smaller are formed at two locations in the axial direction. In negative pressure spool 44, recessed section is formed on the upper end. Spring 46 that biases negative pressure spool 44 downward is disposed between the bottom face of the recessed section and the upper end face of negative pressure spool chamber 45. In addition, through hole 44c is formed that communicates with an opening provided on the bottom face of the recessed section of negative pressure spool 44 and penetrates first small diameter section 44a in the radial direction. Negative pressure spool 44 is positioned below negative pressure spool chamber 45 due to biasing by spring 46 (FIG. 5(a)) when negative pressure is not input from air flow path 40 to input port 45a (including when positive pressure is input). At this time, negative pressure spool 44 blocks communication between through hole 44c and output port 45b and communicates between atmosphere open port 45c and branched path communication port 45d via the second small diameter section 44b. Therefore, negative pressure supply path 41a and branch path 41b are provided with atmospheric pressure. In addition, negative pressure spool 44 moves upward against biasing by spring 46 and is positioned above negative pressure spool chamber 45 (FIG. 6) when negative pressure is input from air flow path 40 to input port 45a. At this time, negative pressure spool 44 blocks communication between atmosphere open port 45c and branched path communication port 45d while through hole 44c and output port 45b communicate via the first small diameter section 44a. Thereby, input port 45a and output port 45b communicate and negative pressure supply path 41a and branch path 41b are provided with negative pressure.

Positive pressure spool chamber 48 is a cylindrical cavity and is formed of input port 48a into which air is input from air flow path 40 on the lower end in the axial direction. In addition, positive pressure spool chamber 48 is formed of output port 48b that is connected to positive pressure supply path 41c on the side, and atmosphere open port 48c that is connected to the outside (open to the air). Note that, output port 48b is an element that does not appear on the A-A cross section, but is illustrated in FIG. 5(a).

Positive pressure spool 47 is formed to have a diameter to be able to slide in positive pressure spool chamber 48, and is a stepped shaft-like member in which a small diameter section 47a that is smaller by one step in the center portion in the axial direction is formed. In positive pressure spool 47, a recessed section is formed on the upper end. Spring 49 that biases positive pressure spool 47 downward is disposed between the bottom face of the recessed section and the upper end face of positive pressure spool chamber 48. Positive pressure spool 47 is positioned below positive pressure spool chamber 48 due to biasing by spring 49 (FIG. 5(a)) when positive pressure is not input from air flow path 40 to input port 48a (including when negative pressure is input). At this time, positive pressure spool 47 communicates between output port 48b and atmosphere open port 48c via the small diameter section 47a while blocking communication between input port 48a and the output port 48b. Therefore, positive pressure supply path 41c is provided with atmospheric pressure. In addition, positive pressure spool 47 moves upward against biasing by spring 49 and is positioned above positive pressure spool chamber 48 (FIG. 8) when positive pressure is input from air flow path 40 to input port 48a. At this time, positive pressure spool 47 blocks communication between output port 48b and atmosphere open port 48c while communicating between input port 48a and output port 48b. Thereby, positive pressure supply path 41c is provided with positive pressure.

Pusher cylinder 37 is provided with hollow cylindrical shape first piston 51 that slides within the cylinder in the up-down direction, second piston 52 that slides within first piston 51 in the up-down direction, and piston rod 53 that is formed integrally with second piston 52 and penetrates first piston 51 and pusher cylinder 37 to protrude downward. Pusher member 36 is attached to the lower end (distal end) of piston rod 53 via connection plate 36a (refer to FIG. 2). First piston 51 has a step section that is formed such that the outer diameter on the lower side in the axial direction is one step smaller than an outer diameter on the upper side. First spring 54 that biases first piston 51 upward is disposed between the lower face of the step section and the bottom face of pusher cylinder 37. In addition, annular end plate 56 on which opening section 56a is formed in the middle is attached to the upper end of first piston 51. In second piston 52, a recessed section is formed on the upper end. Second spring 55 that biases second piston 52 (piston rod 53, pusher member 36) downward is disposed between the bottom face of the recessed section and the lower face of end plate 56. In addition, an inner section of pusher cylinder 37 is partitioned into lower negative pressure chamber 37a and upper positive pressure chamber 37b (refer to FIG. 6) by first piston 51. Negative pressure chamber 37a is connected to negative pressure supply path 41a, and positive pressure chamber 37b is connected to positive pressure supply path 41c.

Cavity section 51a that is slightly recessed in the upper portion of the outer circumferential surface is formed all around first piston 51 (refer to FIG. 2). Pusher cylinder 37 is provided with locking member 57 that is formed in a size to fit in cavity section 51a inside the cylinder wall, and movement path 58 along which locking member 57 is movable is formed within the cylinder wall. In movement path 58, one end is at non-protrusion position 58a at which locking member 57 does not protrude inside the cylinder, and the other end is at protrusion position 58b at which locking member 57 partially protrudes inside the cylinder. Movement path 58 is connected to communication path 59 at the protrusion position 58b side. Communication path 59 is connected to communication supply path 41d that leads to communication path output port 40b of air flow path 40, and positive pressure or negative pressure of air flow path 40 are supplied via communication supply path 41d. In addition, air that is supplied to communication path 59 acts from the protrusion position 58b side to within the movement path 58. Therefore, locking member 57 is pulled out from non-protrusion position 58a and moves up to protrusion position 58b when negative pressure acts in movement path 58, and is extruded from protrusion position 58b and moves up to non-protrusion position 58a when positive pressure acts in movement path 58.

Second piston 52 and piston rod 53 are integrally formed, and rod-inner flow path 53a is formed therein. With rod-inner flow path 53a, one end is open to the side below piston rod 53, and the other end is open to the side of second piston 52. Therefore, rod-inner flow path 53a communicates (is open to the air) with the outside when piston rod 53 moves downward and one end opening of rod-inner flow path 53a is exposed to the outside.

Mounting operation of the component P of component mounting device 10 configured in this manner will be described below, and description will be made below focusing on operation of component chuck device 30. First, CPU 81 of control device 80 controls moving mechanism 60 such that head 20 (component chuck device 30) moves to the supply position of component supply device 12. Next, CPU 81 controls head 20 such that component chuck device 30 has a height position and orientation to be able to grip the component P, and controls electromagnetic valve 70 such that negative pressure is supplied from negative pressure source 72 so as to grip the component P in component chuck device 30. FIGS. 6(a) to 6(d) illustrate operation of component chuck device 30 during negative pressure supply.

Figure 6:
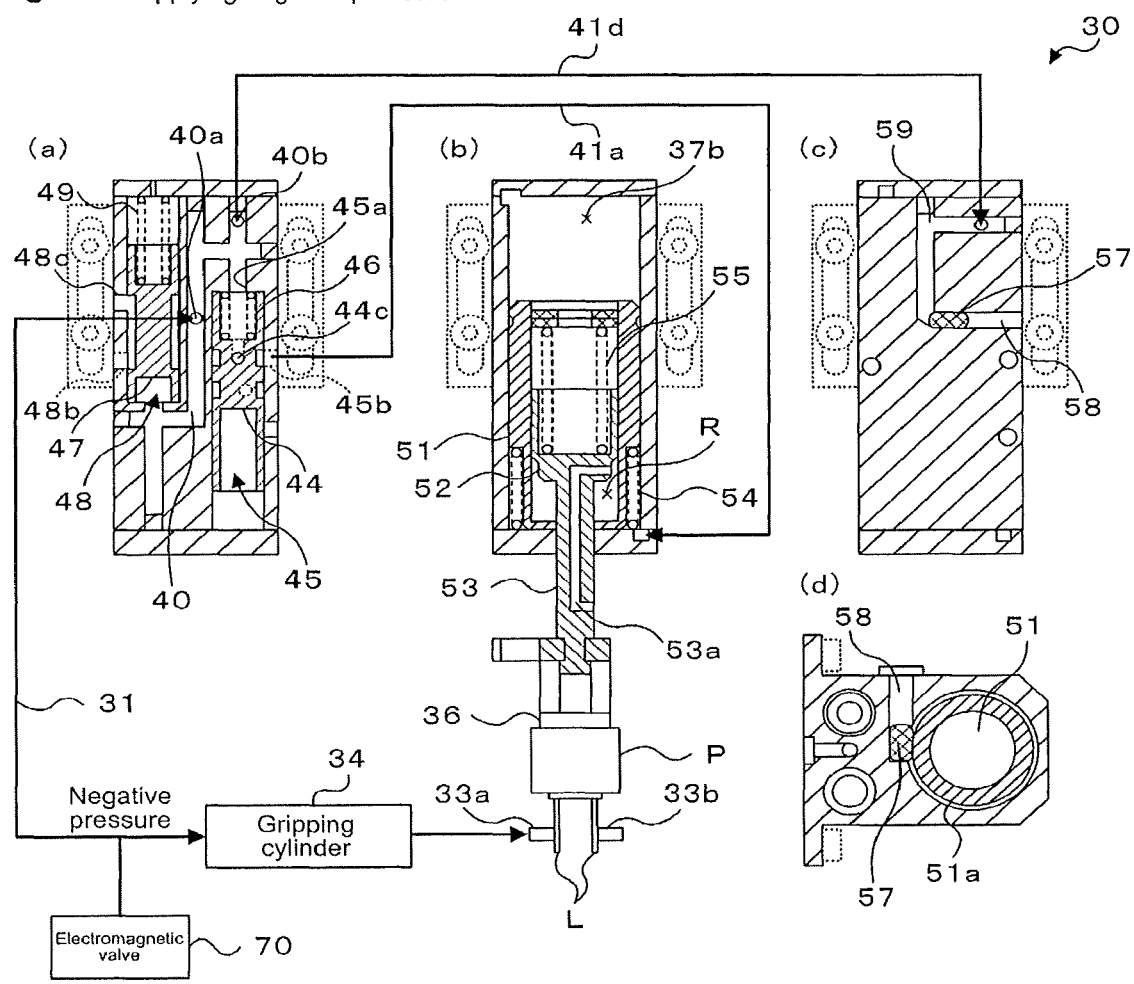
FIG. 6 illustrates operation of component chuck device 30 during negative pressure supply.

As shown in FIG. 6, in a case where negative pressure is supplied, gripping mechanism 32 grips the component P by moving gripping claws 33a and 33b by driving of gripping cylinder 34 from a standby position in a closing direction. Gripping mechanism 32 (gripping claws 33) grip the leads L of the component P. Therefore, even if slight warpage or the like is present in the leads L, it is possible to suitably guide the leads L into the holes H. Since pusher mechanism 35 supplies negative pressure to air flow path 40, negative pressure spool 44 is positioned upward and communicates between input port 45a and output port 45b, and positive pressure spool 47 is positioned downward and communicates between output port 48b and atmosphere open port 48c. Therefore, negative pressure is provided inside negative pressure supply path 41a and air is pressurized inside positive pressure supply path 41c, therefore negative pressure is provided inside negative pressure chamber 37a of pusher cylinder 37 and air is pressurized inside positive pressure chamber 37b. Thereby, first piston 51 moves downward against biasing by first spring 54, and first piston 51 stops at a position (lower end position) at which the lower face of first piston 51 abuts with the bottom face of pusher cylinder 37. At this time, cavity section 51a of first piston 51 has the same height position as movement path 58.

When first piston 51 moves downward, second piston 52 (piston rod 53) is pressed down by biasing by second spring 55, therefore pusher member 36 also moves downward. Then, when pusher member 36 abuts with the upper face of the component P, reaction force from the component P that is gripped in gripping mechanism 32 is received, therefore second spring 55 contracts and second piston 52 (piston rod 53) stops. Therefore, pusher mechanism 35 maintains a state in which pusher member 36 abuts with the upper face of the component P due to biasing by second spring 55. In a case where gripping mechanism 32 grips the leads L of the component P, the component P tends to tilt with the gripping position as a support point, but it is possible to prevent tilting of the component P to stabilize the posture by pressing the upper face of the component P using pusher member 36. In this arrangement, component chuck device 30 (gripping mechanism 32) is able to grip various components P with different heights. In the present embodiment, when pusher member 36 abuts with the upper face of the component P, second piston 52 (piston rod 53) stops. Therefore, whatever the height of the component P that is gripped in a range of a stroke of second piston 52, it is possible to suitably press the upper face of the component P.

In addition, since negative pressure is provided within communication supply path 41d that leads to communication path output port 40b of air flow path 40, negative pressure is provided within communication path 59 and negative pressure acts on movement path 58. Therefore, locking member 57 moves from non-protrusion position 58a up to protrusion position 58b, and a part protrudes inside the cylinder. As described above, cavity section 51a of first piston 51 that is at the lower end position is at the same height position as movement path 58, therefore a portion of locking member 57 that protrudes from protrusion position 58b enters cavity section 51a. Thereby, first piston 51 is locked at the lower end position.

In addition, the opening on one end of rod-inner flow path 53a is exposed to the outside, and rod-inner flow path 53a is open to the air. Therefore, within first piston 51, atmospheric pressure is introduced within cavity R that is below second piston 52. In this arrangement, it is difficult for piston rod 53 to seal apart that first piston 51 penetrates without leakage, and there may be negative pressure within cavity R when negative pressure chamber 37a is provided with negative pressure. In this case, there is a concern that pressing force of pusher member 36 will become excessive since second piston 52 (piston rod 53) is lowered not only by the biasing by second spring 55 but also by the negative pressure. In the present embodiment, generation of such excessive pressing force is prevented by suppressing negative pressure within cavity R by introducing atmospheric pressure from rod-inner flow path 53a within cavity R. Thereby, pusher mechanism 35 is able to lightly press the upper face of the component P with appropriate force, therefore it is possible appropriately hold the component posture.

When the component P is chucked in component chuck device 30, CPU 81 controls moving mechanism 60 such that head 20 (component chuck device 30) moves up to the mounting position of the substrate S, and controls head 20 such that the leads L of the component P are at a height position and an orientation at which it is possible to insert into the holes H of the substrate S. CPU 81, for example, lowers head 20 to a height at which the distal end of the leads L is directly above the holes H (height at which the distal ends fit into the holes H). Then, CPU 81 controls electromagnetic valve 70 so as to stop supply of negative pressure from the negative pressure source 72 and switches to positive pressure since the lead L is inserted into the hole H by component chuck device 30. FIGS. 7(a) to 7(d) illustrate operation of component chuck device 30 while negative pressure supply is stopped.

Figure 7:
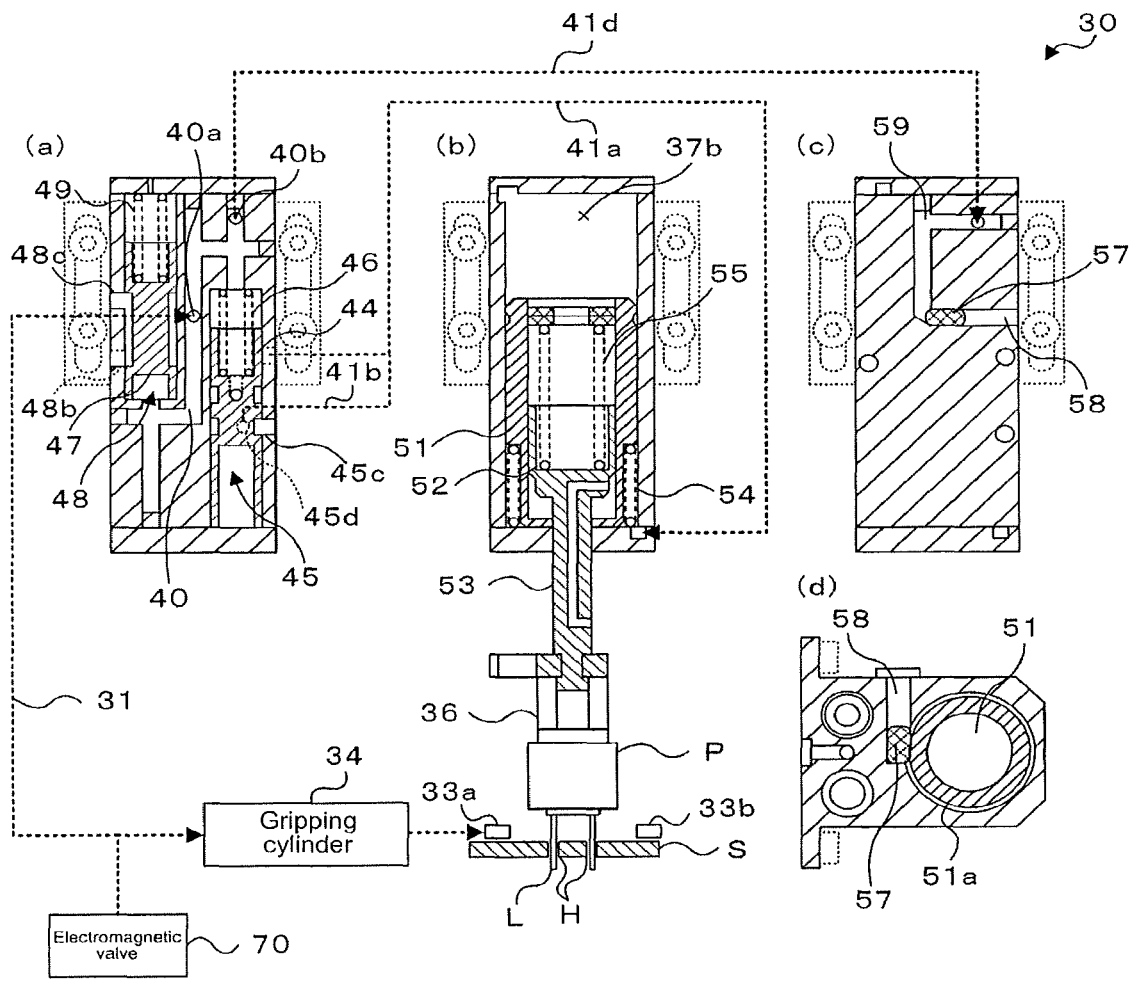
FIG. 7 illustrates operation of component chuck device 30 while negative pressure supply is stopped.

As shown in FIG. 7, when supply of negative pressure is stopped, gripping mechanism 32 is set in a release state in which gripping of the component P by gripping claws 33a and 33b is released. Since pusher mechanism 35 does not supply negative pressure to air flow path 40, negative pressure spool 44 moves downward within negative pressure spool chamber 45 by biasing by spring 46 and communicates between atmosphere open port 45c and branch path communication port 45d. Note that, positive pressure spool 47 does not change the position from FIG. 6. Therefore, inside of negative pressure supply path 41a changes from negative pressure to atmospheric pressure, and the inside of positive pressure supply path 41c remains at the atmospheric pressure, therefore both of negative pressure chamber 37a and positive pressure chamber 37b of the pusher cylinder 37 are provided with atmospheric pressure. In addition, supply of negative pressure to communication supply path 41d and communication path 59 is stopped, but since positive pressure does not act on movement path 58, locking member 57 remains at protrusion position 58b. Therefore, locking of first piston 51 is maintained, and first piston 51 does not move upward due to biasing by first spring 54. Thereby, even if supply of negative pressure stops (also when switching from negative pressure to positive pressure), pusher member 36 continues to abut with the component P, therefore it is possible to appropriately prevent falling of the component P. Note that, even in a device in which gripping claws 33a and 33b are open when positive pressure is supplied, the same effect is exhibited since gripping force is reduced when switching from negative pressure to positive pressure.

Meanwhile, since there is no reaction force from the component P by releasing gripping, second spring 55 extends and second piston 52 (piston rod 53) moves downward. That is, pusher member 36 is moved downward due to biasing by second spring 55 and the component P is extruded, therefore it is possible to insert the leads L into the holes H. In this manner, in a state after supply of negative pressure is stopped, pusher member 36 is extruded downward while continuing to abut with the upper face of the component P, therefore it is possible to insert the leads L into the holes H while holding the posture of the component P. Note that, the protrusion amount (stroke amount) of piston rod 53 is set to an amount at which it is possible to secure an extrusion amount of pusher member 36 that is necessary to insert the leads L into the holes H even for a component P with the lowest height.

When positive pressure is supplied from positive pressure source 74 to component chuck device 30, CPU 81 controls lead processing device 19 so as to process the leads L when the component P is mounted on the substrate S. FIGS. 8(a) to 8(d) illustrate operation of component chuck device 30 during positive pressure supply.

Figure 8:
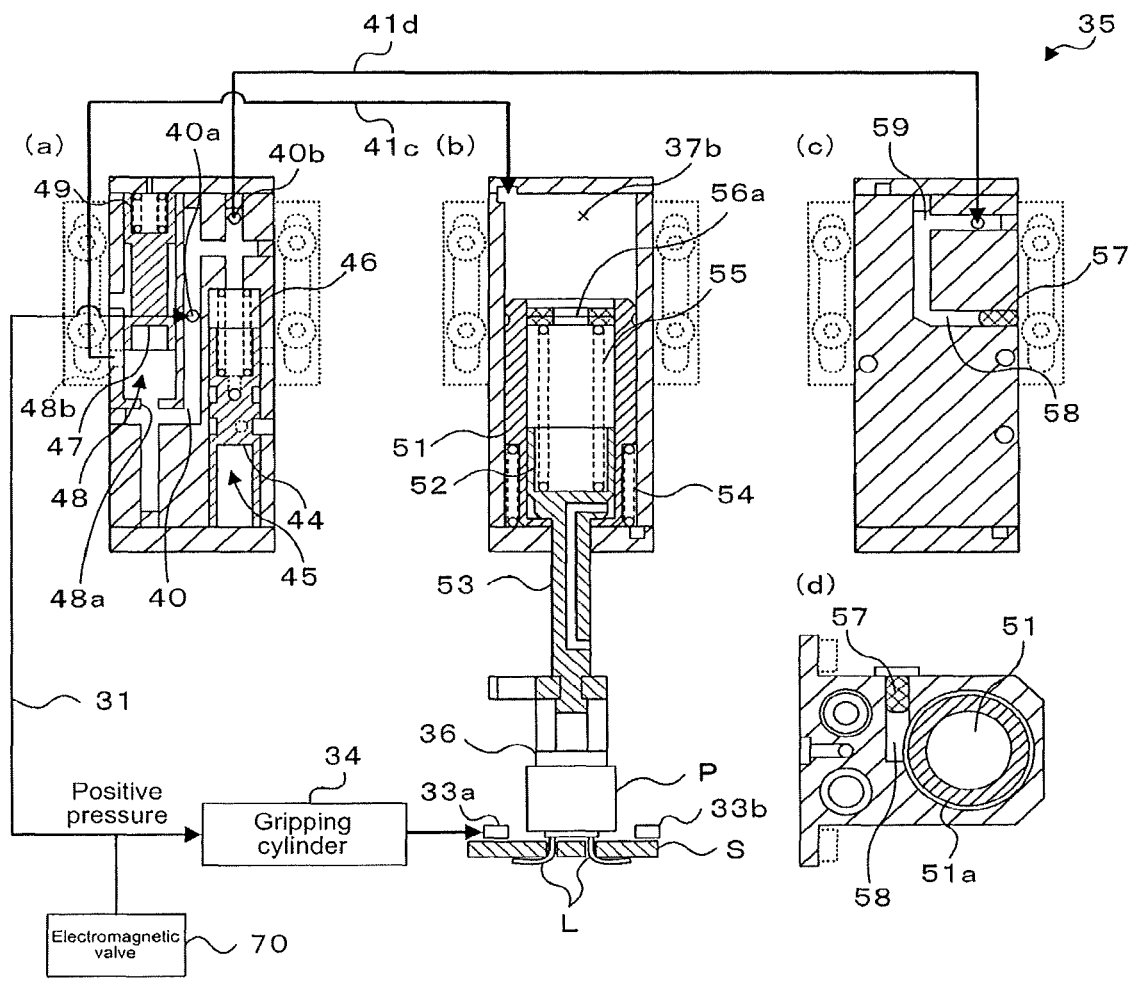
FIG. 8 illustrates operation of component chuck device 30 during positive pressure supply.

As shown in FIG. 8, even if positive pressure is supplied, gripping claws 33a and 33b of gripping mechanism 32 remain in the release state (positioned at the standby position). Since pusher mechanism 35 supplies positive pressure to air flow path 40, positive pressure spool 47 is positioned upward within positive pressure spool chamber 48 and communicates between input port 48a and output port 48b. Note that, negative pressure spool 44 does not change the position from FIG. 7. Therefore, atmospheric pressure remains within negative pressure supply path 41a and negative pressure is provided within positive pressure supply path 41c from atmospheric pressure, therefore atmospheric pressure remains within negative pressure chamber 37a of pusher cylinder 37 and positive pressure is provided within positive pressure chamber 37b. Positive pressure that is introduced to positive pressure chamber 37b acts on the upper face of end plate 56 and first piston 51. In addition, introduced air with positive pressure flows from opening section 56a of end plate 56 to within first piston 51, therefore positive pressure acts on the upper face of second piston 52. Therefore, downward force acts on both of first piston 51 and second piston 52. In addition, positive pressure is supplied to communication supply path 41d and communication path 59 and positive pressure acts on movement path 58, therefore locking member 57 moves from protrusion position 58b to non-protrusion position 58a. Accordingly, locking member 57 exits from cavity section 51a of first piston 51, and locking of first piston 51 is released. However, downward force acts on first piston 51, therefore first piston 51 remains at the lower end position without lifting. In the present embodiment, the downward force is caused to act on first piston 51 and second piston 52 due to supply of positive pressure, therefore in addition to biasing force of second spring 55, it is possible to extrude pusher member 36 by force that acts due to positive pressure. Accordingly, it is possible to press the component P using pusher member 36 with a larger force than when negative pressure is supplied. Therefore, even in a case where it is difficult to insert the leads L into the holes H due to warping or the like being present in the leads L, it is possible to appropriately push in the leads L into the holes H. In this arrangement, when lead processing device 19 performs processing on the leads L, upward force acts on the component P. In the present embodiment, the component P is pressed by pusher member 36 at a high force due to supply of the positive pressure, therefore it is possible to appropriately prevent lifting up of the component P when processing of the leads L is performed. That is, it is possible to stabilize the component posture when processing of the leads L is performed.

When bending of the leads L is complete, CPU 81 controls electromagnetic valve 70 such that air supply path 31 (air flow path 40) is open to the air. Thereby, pusher mechanism 35 moves downward within positive pressure spool chamber 48 by biasing by spring 49 by positive pressure spool 47 and communicates between output port 48b and atmosphere open port 48c. Note that, negative pressure spool 44 does not change the position from FIG. 7. Therefore, atmospheric pressure remains within negative pressure supply path 41a and within positive pressure supply path 41c changes from positive pressure to atmospheric pressure, therefore both negative pressure chamber 37a and positive pressure chamber 37b of pusher cylinder 37 are provided with atmospheric pressure. Locking of first piston 51 has already been released, therefore first piston 51 moves upward due to biasing by first spring 54 and returns to an initial position (refer to FIG. 5).

Correspondence relationships between configuration elements of the present embodiment and configuration elements of the present invention arranged as such is clarified below. Component chuck device 30 of the present embodiment is equivalent to the component chuck device of the present invention, gripping mechanism 32 is equivalent to the gripping mechanism, pusher member 36 is equivalent to the holding member, and pusher mechanism 35 is equivalent to the holding mechanism. In addition, pusher cylinder 37 is equivalent to the cylinder, and flow path switching valve 39 is equivalent to the flow path switching section. In addition, cavity section 51a is equivalent to the cavity section, locking member 57 is equivalent to the locking member, movement path 58 is equivalent to the movement path, and communication path 59 is equivalent to the communication path. In addition, moving mechanism 60 is equivalent to moving mechanism.

According to component chuck device 30 described above, pusher mechanism 35 is configured such that pusher member 36 acts to be able to hold the posture of the component P in both a state in which negative pressure is supplied and a state after supply of negative pressure is stopped (during switching). Thereby, it is possible to continue holding the posture of the component P even if supply of negative pressure stops and gripping of the component P by gripping mechanism 32 is released, therefore it is possible to stabilize the posture of the component P while mounted. Note that, in component mounting device 10, component chuck device 30 is detachably attached with respect to head 20, therefore component mounting device 10 exhibits the same effect as the effect of component chuck device 30.

In addition, in component chuck device 30, pusher member 36 presses the component P from above in a case where either of positive pressure or negative pressure is supplied. Therefore, it is possible to stabilize the posture of the component P by supporting the upper face of the component P. Component chuck device 30 is configured such that pressing force of pusher member 36 is larger in a case where positive pressure is supplied than in the case where negative pressure is supplied. Therefore, in a case where negative pressure is supplied, it is possible to prevent pressing in of the gripped component P more than necessary by pusher member 36. In addition, in a case where the positive pressure is supplied, it is possible to prevent lifting up of the component P during processing of the lead L.

In addition, pusher mechanism 35 of component chuck device 30 is provided with pusher cylinder 37 that moves pusher member 36 vertically, and flow path switching valve 39 that switches supply of positive pressure and negative pressure to pusher cylinder 37. Pusher cylinder 37 is provided with hollow cylindrical shape first piston 51 that slides in the cylinder in the up-down direction, second piston 52 that slides within first piston 51 in the up-down direction, and piston rod 53 that is formed integrally with second piston 52. First piston 51 moves up to the lower end position (predetermined position) against biasing by first spring 54 when negative pressure chamber 37a is provided with negative pressure, and maintains the lower end position when positive pressure chamber 37b is provided with positive pressure. In addition, second piston (piston rod 53) moves downward due to movement of first piston 51 by biasing by second spring 55 and extrudes pusher member 36, and extrudes pusher member 36 by positive pressure in addition to biasing by second spring 55 when positive pressure chamber 37b is provided with positive pressure. Therefore, it is possible to dispose second piston 52 within first piston 51, prevent an increase in the size of pusher cylinder 37, and configure pusher mechanism 35 to be compact.

In addition, in first piston 51 of component chuck device 30, cavity section 51a is formed on the sliding surface of pusher cylinder 37. Pusher cylinder 37 is provided with locking member 57 having a size that is able to enter cavity section 51a, and movement path 58 is formed that moves between non-protrusion position 58a at which locking member 57 does not protrude from the inside the cylinder and protrusion position 58b at which locking member 57 partially protrudes from inside the cylinder. Then, first piston 51 is locked by locking member 57 moving to protrusion position 58b and entering cavity section 51a of first piston 51 when negative pressure acts on movement path 58. In addition, locking of first piston 51 is released by locking member 57 moving to non-protrusion position 58a and exiting from cavity section 51a when positive pressure acts on movement path 58. Therefore, even if negative pressure is not supplied (in a state of atmospheric pressure), it is possible to lock first piston 51 using locking member 57. Accordingly, it is possible to continue holding the posture of the component P by pusher mechanism 35 even while switching from negative pressure to positive pressure.

In addition, pusher mechanism 35 moves second piston 52 (piston rod 53) downward accompanying movement of first piston 51 by biasing by second spring 55 until pusher member 36 abuts with the upper face of the component P, and holds the position of second piston 52 (piston rod 53) when abutting with the component P by second spring 55 contracting when pusher member 36 abuts with the upper face of the component P. Therefore, even in a case where any component P out of various components P with different heights is gripped, it is possible for pusher member 36 to lightly abut with the component P. That is, it is possible to appropriately hold various components P.

In addition, gripping mechanism 32 and pusher mechanism 35 of component chuck device 30 are supplied with negative pressure from the same negative pressure source 72. Therefore, component chuck device 30 switches supply of pressure to pusher mechanism 35 at a timing at which gripping of the component P by gripping mechanism 32 is released, therefore it is highly necessary to hold the posture of the component P after supply of negative pressure stops.

Note that, needless to say, the present invention is not limited to the embodiments described above, and it is possible to execute various forms within the technical scope of the present invention.

For example, in the embodiment described above, pusher cylinder 37 is provided with first piston 51, second piston 52 (piston rod 53), first spring 54, and second spring 55, but is not limited to such a configuration. Pusher cylinder 37 may have any configuration as long as pusher member 36 acts to be able to hold the component P in either a state in which negative pressure is supplied or a state after supply of negative pressure is stopped (during switching). In addition, rod-inner flow path 53a is provided inside second piston 52 and piston rod 53, but rod-inner flow path 53a may not be provided by increasing sealability of piston rod 53 and first piston 51. In addition, first piston 51 is lowered up to the lower end position when negative pressure is supplied, but is not limited thereto, and may be lowered up to a predetermined position before the lower end position when negative pressure is supplied and may lowered up to the lower end position when positive pressure is supplied. In addition, the component P may be pressed or the like by pusher member 36 at the same pressing force when negative pressure is supplied and when positive pressure is supplied.

In the embodiment described above, the posture of the component P is held using pusher mechanism 35 that causes pusher member 36 to abut with the upper face of the component P as the holding mechanism, but is not limited thereto, and any mechanism may be used as long as the mechanism is able to hold the posture of the component P. For example, in the manner of gripping mechanism 32, the claws may be configured to be able to hold the component in either of a state in which negative pressure is supplied and a state after supply of negative pressure is stopped using a pair of claws or multiple pairs that are able to open and close.

In the embodiment described above, first piston 51 is locked by locking member 57, but is not limited thereto, and first piston 51 does not have to be locked, and locking member 57 is not required. However, it is preferable that first piston 51 is locked since pusher member 36 continues to abut with the upper face of the component P.

In the embodiment described above, in gripping mechanism 32 and pusher mechanism 35, positive pressure is supplied from the same positive pressure source 74 and negative pressure is supplied from the same negative pressure source 72, but are not limited thereto, positive pressure may be supplied from separate positive pressure sources and negative pressure may be supplied from separate negative pressure sources.

INDUSTRIAL APPLICABILITY

The present invention is usable in an industry for manufacturing the component chuck device in which a gripped component is mounted on a substrate.

REFERENCE SIGNS LIST

10: component mounting device, 12: component supply device, 14: tape feeder, 16: substrate conveyance device, 18: substrate holding device, 19: lead processing device, 20: head, 22: lifting and lowering mechanism, 24: rotating mechanism, 30: component chuck device, 31: air supply path, 31a: connection port, 32: gripping mechanism, 33, 33a, 33b: gripping claw, 34: gripping cylinder, 35: pusher mechanism, 36: pusher member, 36a: connection plate, 37: pusher cylinder, 37a: negative pressure chamber, 37b: positive pressure chamber, 39: flow path switching valve, 40: air flow path, 40a: air supply port, 40b: output port, 41a: negative pressure supply path, 41b: branched path, 41c: positive pressure supply path, 41d: communication supply path, 44: negative pressure spool, 44a: first small diameter section, 44b: second small diameter section, 44c: through hole, 45: negative pressure spool chamber, 45a: input port, 45b: output port, 45c: atmosphere open port, 45d: branched path communication port, 46: spring, 47: positive pressure spool, 47a: small diameter portion, 48: positive pressure spool chamber, 48a: input port, 48b: output port, 48c: air opening, 49: spring, 51: first piston, 51a: cavity section, 52: second piston, 53: piston rod, 53a rod-inner flow path, 54: first spring, 55: second spring, 56: endplate, 56a: opening section, 57: locking member, 58: movement path, 58a: non-protrusion position, 58b: protrusion position, 59: communication path, 60: moving mechanism, 66: mark camera, 68: parts camera, 70: electromagnetic valve, 72: negative pressure source, 74: positive pressure source, 80: control device, 81: CPU, 82: ROM, 83: HDD, 84: RAM, 85: input and output interface, 86: bus, L: lead, H: hole, P: component, S: substrate

The invention claimed is:

1. A component chuck device configured to insert an insertion section of a gripped component into an insertion target section of a substrate, the component chuck device comprising:
    a gripping mechanism configured to grip the component in a state in which negative pressure is supplied to the gripping mechanism to close grippers of the gripping mechanism to grip the component; and
    a holding mechanism configured to hold a posture of the component gripped by the gripping mechanism using a holding member in a state in which negative pressure is supplied to the holding mechanism,
    wherein the holding mechanism is configured to operate to hold the posture of the component using the holding member in both the state in which negative pressure is supplied to the gripping mechanism and the holding mechanism and a state after the supply of negative pressure supplied to the gripping mechanism and the holding mechanism is stopped, wherein the gripping mechanism is configured to operate to open the grippers to release the component when the negative pressure supplied to the gripping mechanism and the holding mechanism is stopped.

2. The component chuck device according to claim 1, wherein the holding mechanism is configured to hold the posture of the component by pressing the component from above using the holding member in both the state in which negative pressure is supplied to the holding mechanism and a state in which positive pressure is supplied to the holding mechanism.

3. The component chuck device according to claim 1, wherein in the holding mechanism, pressing force on the component by the holding member in a state where positive pressure is supplied to the holding mechanism is larger than that in the state where the negative pressure is supplied to the holding mechanism.

4. The component chuck device according to claim 1, wherein the holding mechanism is provided with a cylinder configured to move the holding member vertically and a flow path switching section configured to switch a flow path for air that is supplied to the cylinder,
    the cylinder is provided with a hollow first piston configured to slide within the cylinder, a second piston configured to slide within the first piston, a piston rod that penetrates the cylinder and the first piston, and in which the holding member is attached to the lower end and moves integrally with the second piston, a first spring configured to bias the first piston upward with respect to the cylinder, and a second spring configured to bias the second piston downward with respect to the first piston, the inside of the cylinder being partitioned by the first piston into a lower negative pressure chamber and an upper positive pressure chamber,
    the flow path switching section is configured to switch the flow path such that the negative pressure chamber is provided with negative pressure and the positive pressure chamber is open to the air when negative pressure is supplied to the flow path switching section, and switch the flow path such that the positive pressure chamber is provided with positive pressure and the negative pressure chamber is open to the air when positive pressure is supplied to the flow path switching section,
    the first piston moves downward to a predetermined position within the cylinder against biasing by the first spring when the negative pressure chamber is provided with negative pressure, and maintains the predetermined position or moves further downward than the predetermined position when the positive pressure chamber is provided with positive pressure, and
    the second piston and the piston rod are configured to extrude the holding member by moving downward with biasing force of the second spring accompanying downward movement of the first piston, and extrude the holding member by positive pressure that acts on the second piston in addition to biasing by the second spring when the positive pressure chamber is provided with positive pressure.

5. The component chuck device according to claim 4, wherein the first piston is formed with a cavity section on a sliding surface that slides against the inner wall surface of the cylinder,
    the cylinder is provided with a locking member having a size that is able to enter the cavity section, and a movement path is formed such that the locking member moves between a non-protrusion position at which the locking member does not protrude from the inner wall surface and a protrusion position at which the locking member partially protrudes from the inner wall surface,
    the flow path switching section is connected to a communication path that communicates with the movement path at the protrusion position, the communication path is provided with negative pressure when negative pressure is supplied to the flow path switching section, and the communication path is provided with positive pressure when positive pressure is supplied to the flow path switching section, and
    the locking member locks the first piston such that the first piston does not move above the predetermined position, by moving to the protrusion position when the movement path is provided with negative pressure via the communication path and partially entering the cavity section of the first piston at the predetermined position, and releases locking of the first piston by moving to the non-protrusion position and exiting from the cavity section of the first piston when the movement path is provided with positive pressure via the communication path.

6. The component chuck device according to claim 4, wherein the gripping mechanism is able to grip various components with different heights, and
    in the holding mechanism, in a case where the negative pressure chamber is provided with negative pressure and the holding member is extruded, the second piston and the piston rod move downward due to biasing by the second spring until the holding member abuts with the component, and the positions of the second piston and the piston rod are held when abutting with the component due to the second spring contracting when the holding member abuts with the component.

7. The component chuck device according to claim 1, wherein negative pressure is supplied to the gripping mechanism and the holding mechanism from the same negative pressure source.

8. A component mounting device comprising:
    a head to which the component chuck device according to claim 1 is attached; and
    a moving mechanism, wherein the moving mechanism is configured to move the head, wherein a component is mounted on a substrate by an insertion section of the component being inserted into an insertion target section of the substrate by the component chuck device.

* * * * *